United States Patent [19]

Carlson et al.

[11] 4,352,111
[45] Sep. 28, 1982

[54] MULTI-BAND ANTENNA COUPLING NETWORK

[75] Inventors: David J. Carlson; Sander H. C. Tsou, both of Indianapolis, Ind.

[73] Assignee: RCA Corporation, New York, N.Y.

[21] Appl. No.: 228,587

[22] Filed: Jan. 26, 1981

[51] Int. Cl.³ ............................................. H01Q 19/06
[52] U.S. Cl. .................................... 343/860; 343/853
[58] Field of Search ...................... 343/853, 715, 860; 455/193, 191, 286, 290, 132, 140

[56] References Cited

U.S. PATENT DOCUMENTS

| | | |
|---|---|---|
| 1,571,405 | 2/1926 | Goldsmith . |
| 2,619,588 | 11/1952 | Nowak . |
| 2,864,060 | 12/1958 | Batchelor . |
| 3,534,371 | 10/1970 | Seavey .............................. 343/853 |
| 3,725,942 | 4/1973 | Ukmar ................................ 343/860 |
| 3,739,390 | 6/1973 | Poppe, Jr. et al. ................. 343/853 |
| 4,259,673 | 3/1981 | Guretzky . |

OTHER PUBLICATIONS

"Multiplexer Channel-Separating Units Using Interdigital and Parallel-Coupled Filters", by Matthaei and Cristal, published in the IEEE Transaction on Microwave Theory and Techniques, vol. MTT 13, No. 3, May 1965.

"RCA Audio Products Service Data" for the Model RWS849-V radio publsihed by RCA Corporation, Indianapolis, IN.

Primary Examiner—David K. Moore
Attorney, Agent, or Firm—E. M. Whitacre; P. J. Rasmussen; P. M. Emanuel

[57] ABSTRACT

An antenna coupling network for supplying VHF television carriers to a VHF tuner of a television receiver and weather band carriers to a tuner of a weatherband radio incorporated in the television receiver from a single monopole antenna without adverse interaction simply comprises a first wire connected between the monopole antenna and the VHF tuner and a second wire wrapped around the first wire a predetermined number of times and connected at one end to tuner of the weatherband radio. The number of turns are selected to form a series resonance at a midpoint of the weather band. Desirably the other end of the second wire is left unconnected.

9 Claims, 2 Drawing Figures

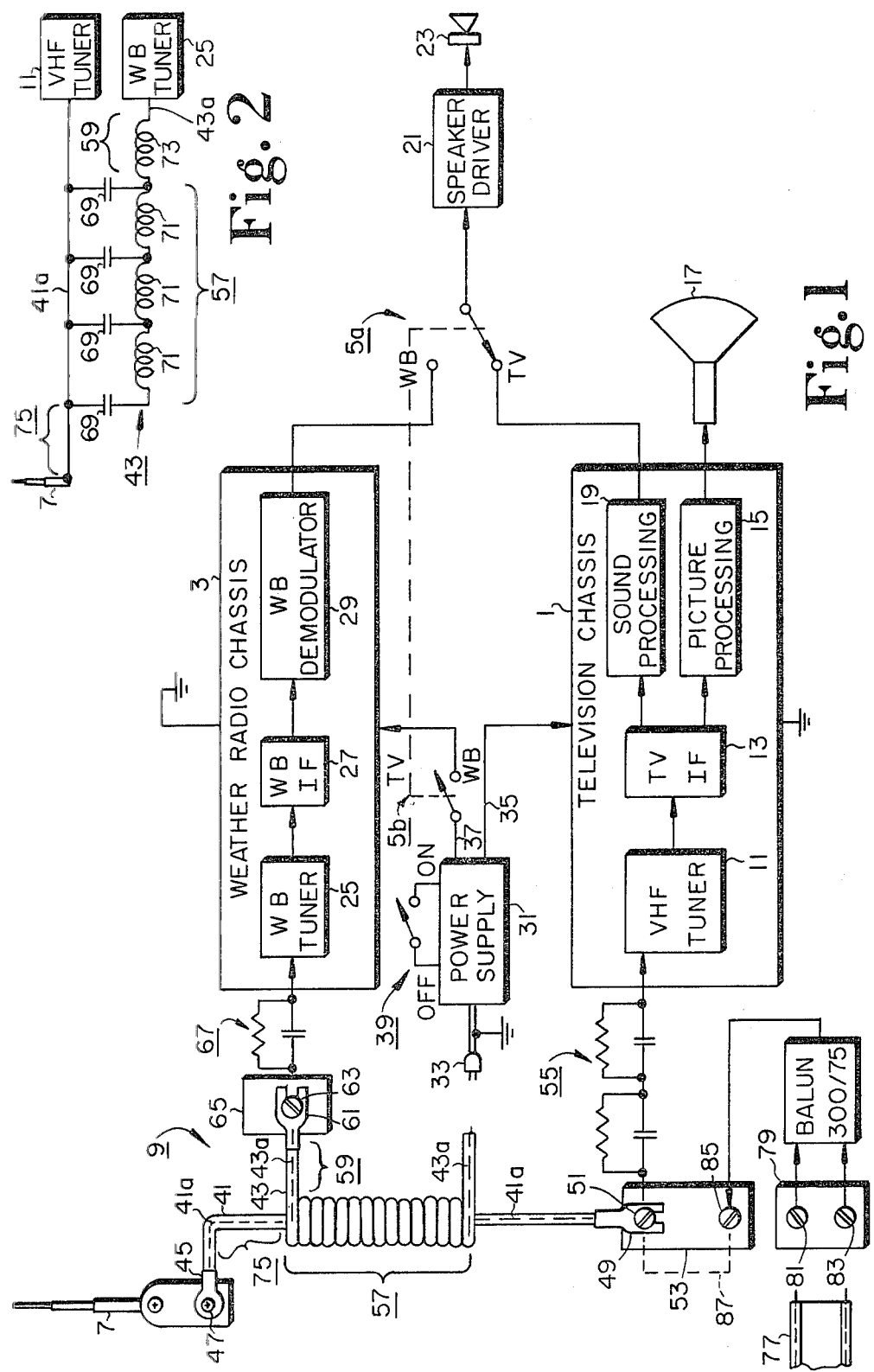

MULTI-BAND ANTENNA COUPLING NETWORK

The present invention pertains to the field of arrangements for supplying RF signals in different bands to respective different tuners from a single antenna. In such arrangements RF carriers in a first band may be withdrawn from the respective first tuner by a second tuner. Such withdrawal of signals is often coloquially referred to as a "suckout". Depending on the amplitude of the signals withdrawn from the first tuner, the information response derived from the carriers processed by the first tuner may be noticeably degraded. Accordingly, a filter which allows RF signals in the second band to pass but rejects signals in the first band may be connected between the antenna and the second tuner.

While discrete components may be used in such a filter, such discrete component filters tend to be expensive due to the cost of the discrete components themselves, the cost of structure for supporting the discrete components and the cost of assembling the discrete components filter.

In addition, discrete components available for such filters may not satisfy desired operating characteristics. For example, if a highly selective filter is desired because the band of the second tuner is narrow, the filter may comprise a series tuned circuit including an inductor and capacitor connected in series between the antenna and the second tuner. The values of the inductor and capacitor are selected to provide a resonance point nominally in the center of the second band. The selectivity (often mathematically referred to by the figure of merit "Q") of such a circuit is directly related to the value of the inductor and inversely related to the value of the inductor and inversely related to the value of the capacitor. Accordingly, if a highly selective filter is desired, the value of the inductor should be relatively high and the value of the capacitor should be relatively low. High value discrete inductors are expensive. Perhaps more importantly, however, low value capacitors are both physically and electrically fragile and may therefore be unacceptable in apparatus where the antenna or connections to the antenna are exposed to users. In such an apparatus failure of the capacitor causing it to short may couple internally generated voltages to the antenna or its connection and may therefore become a hazard.

According to the present invention, a multiband antenna coupling network for supplying RF carriers in different first and second bands by a single antenna to respective first and second bands simply comprises first and second wires, at least one of which is insulated. The first wire is connected between an antenna connection point and the first tuner. The second wire has one end connected to the second tuner and is wrapped around the first wire for a predetermined number of turns to produce, in effect, a tuned circuit having resonant frequency substantially at the center frequency of the second band. Desirably, the other end of the second wire is left unconnected.

The present invention will be described with reference to the accompanying Drawing in which:

FIG. 1 shows partially in picture form and partially in schematic form, a television receiver having a multiband antenna coupling network constructed in accordance with the present invention, and FIG. 2 shows the electrical equivalent circuit of the antenna coupling network of FIG. 1.

As shown in FIG. 1, the television receiver includes both a television chassis 1 and a weather radio chassis 3 and a mode selector switch comprising ganged sections 5a and 5b for selectively enabling the operations of television chassis 1 and weather radio chassis 3. Each of television chassis 1 and weatherband radio chassis 3 receives their respective RF carriers from an extendible monopole antenna 7 which is of the type conventionally provided with television receivers to receive RF carriers in the VHF band. Monopole antenna 7 is coupled to each of the inputs of tuners 11 and 25 in television chassis 1 and weather radio chassis 3, respectively, through an antenna coupling network 9 constructed in accordance with the present invention.

In television chassis 1, a VHF tuner 11 converts RF carriers between 54 MHz and 89 MHz and between 174 and 216 MHz associated with low band VHF channels 2 through 6 and high band VHF channels 7-13, respectively, selected by a viewer to a corresponding IF signal. A UHF tuner (not shown) is also provided for converting RF carriers between 470 and 890 MHZ associated with UHF channels 14 through 83 to a corresponding IF signal. The IF signals are filtered and amplified by an IF section 13. Picture components of the RF signal are processed by a picture section 15 to produce video, color and deflection signals. The latter signals are applied to a picture tube 17 in conventional fashion to produce an image. Sound components of the IF signal are processed by a sound section 19 to produce an audio signal. When mode selection switch section 5a is in the TV position, the audio signal produced by sound section 19 is applied to a speaker driver 21. A speaker 23 is driven by driver 21 to produce an audio response which, when function selector switch section 5a is in the TV position, corresponds to the image produced by picture tube 17.

In weather radio chassis 3, a weather band (WB) tuner 25 converts an amplitude modulated RF carrier in a narrow frequency band approximately between 162.4 and 162.55 MHz allocated specifically for the transmission of weather information to a corresponding IF signal. The latter IF signal is filtered and amplified by an IF section 27. A demodulator 29 produces an audio signal from the processed WB IF signal. When mode selector switch section 5a is in the WB position, the audio signal produced by WB demodulator 29 is applied to speaker driver 21. As a result, when mode selector switch section 5a is in the WB position, speaker 23 produces an audio response conveying weather information.

Supply voltages for television chassis 1 and weather radio 3 are developed by a power supply 31 from the AC line voltage applied through an AC power plug 33. Power supply 31 does not include an input transformer. Accordingly, the chassis ground points for television chassis 1 and weather radio 3 are directly connected to the line ground as is indicated by the common ground symbols. This will become more meaningful in connection with antenna coupling network 9 to be described in greater detail below.

Supply voltage line 35 for television chassis 1 is continuously coupled from power supply 31 to television chassis 1. On the other hand, supply voltage line 37 for weather radio chassis 3 is selectively coupled from power supply 27 to weather radio chassis 3 by mode selector switch section 5b. Accordingly, when an on/-off switch 39 is in the ON position, television chassis 2 is always operating while the operation of weather radio chassis 3 depends on the position of mode selector switch 5a, 5b. When mode selector switch 5a, 5b is in the TV position, television chassis 1 is operating and the audio output signal of its sound processing unit 19 is applied to speaker driver 21. Accordingly, a television image and a corresponding television audio response are produced. When mode selector switch 5a, 5b is in the WB position, while television chassis 1 continues to operate, weather band radio chassis also operates, but the audio output signal of WB demodulator 29, rather than the audio output signal of sound processing unit 19 is applied to speaker driver 21. Accordingly, a television image and a weather audio response are produced at the same time. This feature allows a user to broadcast without interruption of the visual portion of the program he has selected. Such feature is of advantage when it is desired to obtain a weather report without interrupting the visual portion of a program such as a sports program.

Since the RF carriers for television chassis 1 and weather radio 3 are taken from the same antenna, it is desirable that antenna coupling network 9 not only supply RF carriers in the VHF and weather bands to respective tuners 11 and 25, but that it also inhibits RF carriers in the VHF band from being directed to weather radio chassis 3. Without the latter feature, the performance of television chassis 1 could be seriously degraded, e.g., by interference with or loss of the image. Such degradation may be especially manifested in the present receiver arrangement when mode selector switch 5a, 5b is in the WB position so that television chassis 1 is intended to produce an acceptable image while weather radio chassis 3 is operating and therefore particularly susceptible of diverting RF carriers in the low VHF band close to the weather band. However, degradations of the performance may also occur when mode selector 5a, 5b is in the TV position and weather radio chassis is not operating. Accordingly, antenna coupling network 9 may be advantageously used in another receiver also having both a television chassis and a weather radio chassis but in which only one of the television and weather radio chassis is operated at a time.

Antenna coupling network 9 is particularly simple in construction comprising two insulated wires 41 and 43.

Conductor 41a of wire 41 is electrically connected at one end by a terminal 45 and screw 47 to a monopole antenna 7 and at one other end by a terminal 49 and a screw 51 to a monopole antenna connection point of a VHF antenna input assembly 53. VHF antenna input assembly 53 comprises a dielectric, e.g., plastic, plate on which a terminal (not specifically shown) is mounted to receive screw 49. The latter terminal is coupled through a DC isolation network 55 to the input of VHF tuner 11.

A portion 57 of wire 43 is wrapped around wire 41 for a predetermined number of turns N (leaving a portion 59 which is not wrapped around wire 41). Conductor 43a of wire 43 is connected at one end by a terminal 61 and screw 63 to an antenna connection point of a WB antenna input assembly 65. Antenna input assembly 65 comprises a dielectric, e.g., plastic, plate on which a terminal (not specifically shown) is mounted to receive screw 63. The latter terminal is coupled through a DC isolation network 67 to the input of WB tuner 25. The other end of conductor 43a is left unconnected.

In FIG. 2, in which those portions directly corresponding to elements shown in FIG. 1 are identified by the same reference numbers, the electrical equivalent of antenna coupling network 9 comprising wires 41 and 43 is shown. Elements 45, 47, 49, 51, 55, 61, 63, 65 and 67 have been omitted as they do not substantially affect the electrical operation of antenna coupling network 9 in the frequency bands of interest. As is seen, the combination comprising wires 41 and 43, in portion 57, forms a distributed coupling network including a plurality of capacitors 69 (only a few of which have been shown for simplicity) connected in parallel relationship between conductor 41a of wire 41 and conductor 43a of wire 43 and a respective plurality of inductors 71 interposed between capacitors 69 connected in series along conductor 43a of wire 43. The coupling network also includes an inductor 73 representing the inductive contribution of the length of wire 43 in portion 59. If the length of portion 75 of wire 41 between terminal 45 and the beginning of portion 57 of wire 43 is appreciable compared with portion 59 of wire 43, inductor 73 represents the total inductive contribution of portion 75 of wire 41 and portion 59 of wire 43.

In operation antenna coupling network 9 effectively produces a series resonance circuit between monopole antenna 7 and WB tuner 25 in which the effective series capacitance and the effective series inductance are selected, as described below, to produce a series resonance in the midband of the WB range, e.g., as near as possible to 162.475 MHz. The resonant frequency of a simple circuit resonant circuit consisting of an inductor L connected in series with a capacitor C is $$\frac{1}{2\pi \sqrt{LC}}.$$

The resonant frequency selection allows RF carriers in the WB range, e.g., between 162.4 and 162.55 MHz to pass to WB tuner 25. RF carriers outside of the passband of the series tuned circuit produced by antenna coupling network 9 are effectively rejected. Accordingly, television RF carriers in the VHF range are not significantly diverted away from VHF tuner 11 to WB tuner 25.

With respect to the passing of RF carriers in the relatively narrow WB frequency range and rejection of RF carriers in the VHF television range, antenna coupling network 9 is particularly advantageous since it produces a highly tuned, i.e., high "Q" circuit. This is so because its effective series capacitance is relatively small and its effective series inductance is relatively large and, as earlier noted, the Q of series tuned circuit is inversely related to the value of series capacitance and directly related to the value of series inductance.

The number of turns N in which wire 43 is wrapped around wire 41, the length of portion 59 of wire 43 and the length of portion 75 of wire 41 determine the inductance of antenna coupling network 9. The number of turns N also determine the capacitance of portion 57. Thus, the overall length of wire 43 is selected with respect to the desired inductance and the number of turns N is selected to produce a compromise between a low capacitance value and a high inductance value. By way of example, the following is a tabulation of parameters which have been found effective for antenna coupling network 9 when incorporated in a receiver intended for use in the United States for passing RF carriers in the WB range and rejecting RF carriers in the VHF range.

| Element | Parameter |
| --- | --- |
| wire 41 | |
| commercial part number | UL(Underwriter's Laboratory) Style 1015-vinyl insulation 0.03 inches(0.0968 cm)thick 105° C. rating; AWG #22,standard strand copper conductor |
| overall length | 8.5 inches (21.76 cm) |
| length of portion 75 | 2 inches (5.12 cm) |
| wire 43 | |
| commercial part number | same as wire 41 |
| overall length | 2 feet (0.6144 cm) |
| length of portion 59 | 2.5 inches (6.4 cm) |
| number of turns N | 30 |
| length of portion 57(wound) | 3.5 inches (8.89 cm) |

Although monopole antenna 7 is provided with the receiver, users may wish to employ another VHF antenna schematically indicated as 76 such as a roof top, multiple dipole antenna. Such antennas are often coupled to the receiver by a twin lead transmission line such as 77 having a balanced impedance with reference to signal ground of nominally 300 ohms between its conductors. For connection of twin lead transmission line 77, a second VHF antenna input assembly 79, including a dielectric, e.g., plastic plate, with two terminals (not specifically shown) for receiving two screws 81 and 83 to which the conductors of twin lead transmission line 77 may be connected, is provided.

Since the input of VHF tuner 11 typically has an unbalanced input impedance with reference to signal ground nominally at 75 ohms, a balun is connected between the two terminals of second VHF antenna input assembly 79 and a terminal (not specifically shown) on first VHF antenna input assembly 53 which receives a screw 85. When second VHF antenna input assembly 79 is in use, terminal 51 of antenna coupling assembly 9 is disconnected from screw 49 of first VHF antenna input assembly 53 and a conductor 87 is connected between screws 49 and 85. It is noted that while monopole antenna 7 no longer provides RF carriers in the VHF range to VHF tuner 11 in this configuration, conductor 41a being disconnected from screw 51, RF carriers in the WB range continue to be coupled to WB tuner 25 from monopole antenna 7 through antenna coupling network 9.

Since monopole 7, terminal 49 and screw 51 are exposed to contact by users, being located exterior to the cabinet of the receiver, it is desirable that they be isolated from DC voltages and currents developed within the receiver. Desirably two devices are connected in series to provide "double" isolation. In this manner, if one device should fail and thereby short, DC isolation is still maintained by the other device.

In DC isolation network 55 for isolating monopole 7, terminal 49 and screw 51 from the input of VHF tuner 11, double isolation is accomplished by connecting two "capristors", each comprising the parallel combination of a capacitor and a relatively high value resistor, connected in series between screw 51 and the input of VHF tunner 11. The capacitor portions of the "capristors" provide a low impedance path for coupling RF carriers to VHF tuner 11. The resistor portions of the capristors discharge the capacitor portions thereby preventing the accumulation of possibly hazardous charges.

In the DC isolation network isolating monopole 7, terminal 61 and screw 63 from WB tuner 25, since conductor 43a is capacitively coupled to conductor 41a by antenna coupling network 9, antenna coupling network 9 gratuitously provides one DC isolation element so that only a single capristor 67 need be provided between screw 63 and the input of WB tuner 25. While a discrete series resonant network including a discrete capacitor and a discrete inductor would also be beneficial in with respect to allowing RF carriers in the WB to be coupled to WB tuner 25 while rejecting RF carriers in the television VHF band, capacitors employed in such a discrete series resonant circuit, because of the desired high Q, would be physically small. As a result such a discrete capacitor would be much more susceptible to mechanical and electrical failure to create a short circuit than the insulation on wires 41 and 43 of antenna coupling network 9. While both of wires 41 and 43 have been described as having an insulating covering, it is only necessary that one of the wires has an insulating covering as long as that insulating covering be sufficient to prevent mechanical and electrical breakdown for the purposes of DC isolation.

Further with respect to isolating users from voltages developed with the receiver, it is noted that the end of conductor 43a or wire 43 opposite terminal 61 may be unconnected as is specifically shown. This particularly desirable since it has been found convenient in the assembly of the receiver to have terminal 61 and screw 63 external to the receiver cabinet and therefore exposed to contact by users. Thus, if, for example, the unconnected end of conductor 43a were instead connected to signal ground, a potential hazard may arise because, as mentioned above,d signal ground is not isolated from the low side of the AC power line.

Thus what has been described is an antenna coupling network for supplying RF carriers to two tuners for different reception bands from a single antenna without adverse interaction which is of extremely simple construction and which also gratuitously provides DC isolation to external connection points from signals developed in the receiver.

What is claimed is:

1. Apparatus comprising:
   a single antenna for receiving RF carriers in both first and second different bands;
   first and second tuners for tuning said RF carriers in respective ones of said first and second bands;
   a first wire including a first conductor connected between said antenna and a signal input of said first tuner, said first conductor conducting said RF carriers in both of said first and second bands received by said antenna and thereby supplying said RF carriers in said first band to said first tuner;
   a second wire including a second conductor having one end of connected to a signal input of said second tuner
   and being wrapped around the first conductor in a predetermined number of discrete turns without D.C. connection to said first conductor or to said antenna to exhibit a frequency selective characteristic between said first and second conductors having a pass band including said second band and a rejection band including said first band for coupling said RF carriers in said second band from said first conductor to said second conductor and thereby serving to supply said RF carriers in said second band to said second tuner from said antenna while inhibiting said RF carriers in said first band from being diverted from said first tuner to said second tuner.

2. The apparatus recited in claim 1 wherein:
said frequency selective characteristic is that of a tuned circuit having a resonant frequency within said second band.

3. The apparatus recited in claim 2 wherein: the other end of said second conductor is left unconnected.

4. The apparatus recited in claim 3 wherein: both of said conductors are insulated.

5. The apparatus recited in claim 4 wherein:
said first tuner tunes RF carriers in the VHF band; and
said second tuner tunes RF carriers in the weather band.

6. The apparatus recited in claim 5 wherein:
said antenna is a monopole antenna.

7. The apparatus recited in claim 6 further including:
a first terminal connected to one end of said first conductor for connection to said antenna and a second terminal connected to a second end of said first conductor for connection to said signal input of said first tuner;
and
antenna selection means for selectively connecting a second antenna to said signal input of said first tuner.

8. The apparatus recited in claim 7 wherein:
said monopole antenna and at least said second terminal are exposed to contact by users.

9. The apparatus recited in claim 2 wherein:
the length of said second conductor is also selected to couple said RF carriers in said second band from said first conductor to said second conductor and to inhibit said RF carriers in said first band from being diverted from first tuner to said second tuner.

* * * * *